US012412729B2

(12) United States Patent
Hung et al.

(10) Patent No.: US 12,412,729 B2
(45) Date of Patent: Sep. 9, 2025

(54) ATOM PROBE TOMOGRAPHY SPECIMEN PREPARATION

(71) Applicant: Taiwan Semiconductor Manufacturing Co., Ltd., Hsinchu (TW)

(72) Inventors: Shih-Wei Hung, Hsinchu (TW); Jang Jung Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 63 days.

(21) Appl. No.: 18/448,014

(22) Filed: Aug. 10, 2023

(65) Prior Publication Data

US 2023/0386783 A1 Nov. 30, 2023

Related U.S. Application Data

(62) Division of application No. 16/997,801, filed on Aug. 19, 2020, now Pat. No. 11,837,435.

(51) Int. Cl.
*H01J 37/285* (2006.01)
*G01N 1/28* (2006.01)
*G01N 1/32* (2006.01)
*H01L 21/66* (2006.01)

(52) U.S. Cl.
CPC ............ *H01J 37/285* (2013.01); *G01N 1/286* (2013.01); *G01N 1/32* (2013.01); *H01L 22/12* (2013.01); *H01L 22/30* (2013.01); *G01N 2001/2873* (2013.01)

(58) Field of Classification Search
CPC ......... H01L 22/12; H01L 22/30; G01N 1/286; G01N 1/32; G01N 2001/2873; H01J 37/285; G01Q 30/20; G01Q 60/00
See application file for complete search history.

(56) References Cited

U.S. PATENT DOCUMENTS

| | | | | |
|---|---|---|---|---|
| 5,374,868 A | * | 12/1994 | Tjaden | H01J 1/3042 445/51 |
| 5,480,843 A | * | 1/1996 | Park | H01J 9/025 216/11 |
| 6,165,808 A | * | 12/2000 | Zhang | H01J 9/025 445/24 |
| 6,762,543 B1 | * | 7/2004 | Kang | H01J 1/3042 313/309 |

(Continued)

OTHER PUBLICATIONS

W.R McKenzie "Focused ion beam sample preparation for atom probe tomography", 2010, para 1800-1810. (Year: 2010).

*Primary Examiner* — Michael M Trinh
(74) *Attorney, Agent, or Firm* — Seed IP Law Group

(57) ABSTRACT

The disclosure is directed to techniques in preparing an atom probe tomography ("APT") specimen. The disclosed techniques form an APT specimen or sample directly on a DUT region on a wafer. The APT specimen is formed integrally to the substrate or the support structure, e.g., a carrier, under the APT specimen. A laser patterning is conducted to form a trench in the DUT and one or more bump structures in the trench. The laser patterning is relatively coarse and forms a coarse surface texture on each of the bump structures. A low-kV gas ion milling using a dual-beam focused ion beam ("FIB") microscopes is then conducted to shape the bump structures into APT specimen.

15 Claims, 5 Drawing Sheets

(56) References Cited

U.S. PATENT DOCUMENTS

| | | |
|---|---|---|
| 7,981,305 B2 | 7/2011 | Koh et al. |
| 10,684,308 B1 * | 6/2020 | Hirsch ................. H01J 37/285 |
| 10,746,542 B2 | 8/2020 | Hu et al. |
| 11,088,036 B2 | 8/2021 | Hung et al. |
| 2005/0001536 A1 * | 1/2005 | Yamamoto ............ H01J 31/127 |
| | | 313/496 |
| 2012/0117696 A1 | 5/2012 | Hatzistergos et al. |
| 2015/0253353 A1 | 9/2015 | Alvis |
| 2018/0143110 A1 | 5/2018 | Delpy et al. |

* cited by examiner

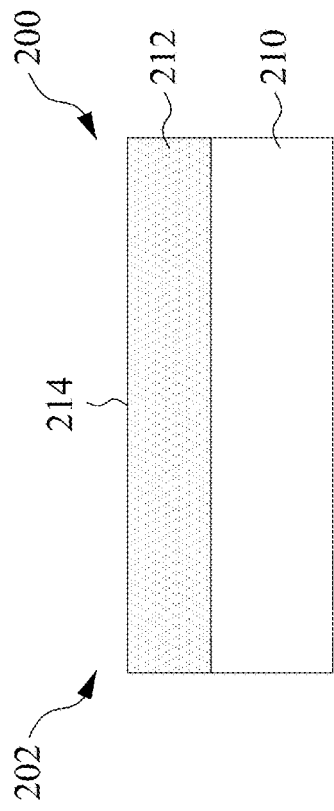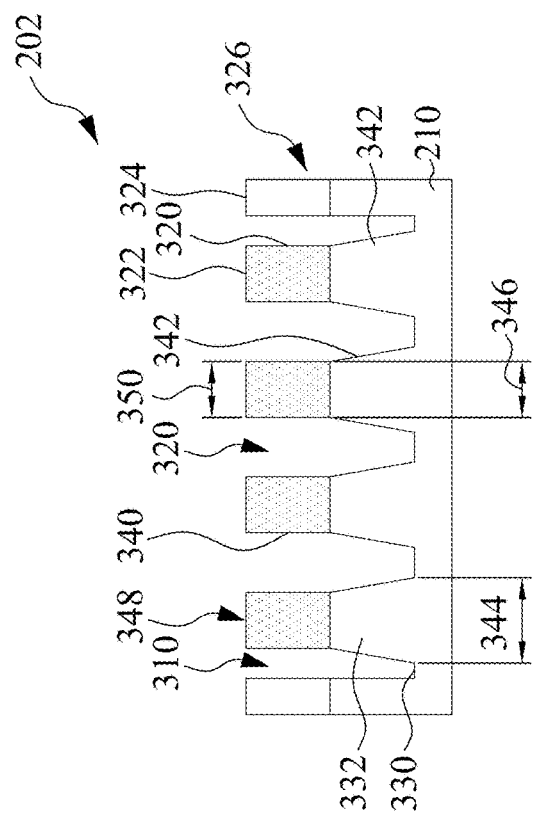

ATOM PROBE TOMOGRAPHY SPECIMEN PREPARATION

BACKGROUND

Atom probe tomography ("APT") has become a promising approach to analyze dopant concentration or distribution in various semiconductor regions of a semiconductor device or structure. In APT, ions are removed from a surface of an APT specimen through application of an electrical pulse, which is referred to as field evaporation. The evaporated ions are imaged and identified based on their mass spectrum peaks in a mass spectrometer. The lateral location of the ions at the surface(s) of the APT specimen is determined based on, e.g., through a time-of-flight sensing mechanism, a time interval for a decoupled ion to travel to a detector. The identified ions and the determined locations thereof are analyzed to reconstruct the specimen with the locations of each ion identified.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 2-7 show an example wafer in various stages of the example process of FIG. 1 according to example embodiments of the disclosure.

DETAILED DESCRIPTION

Figure 1:
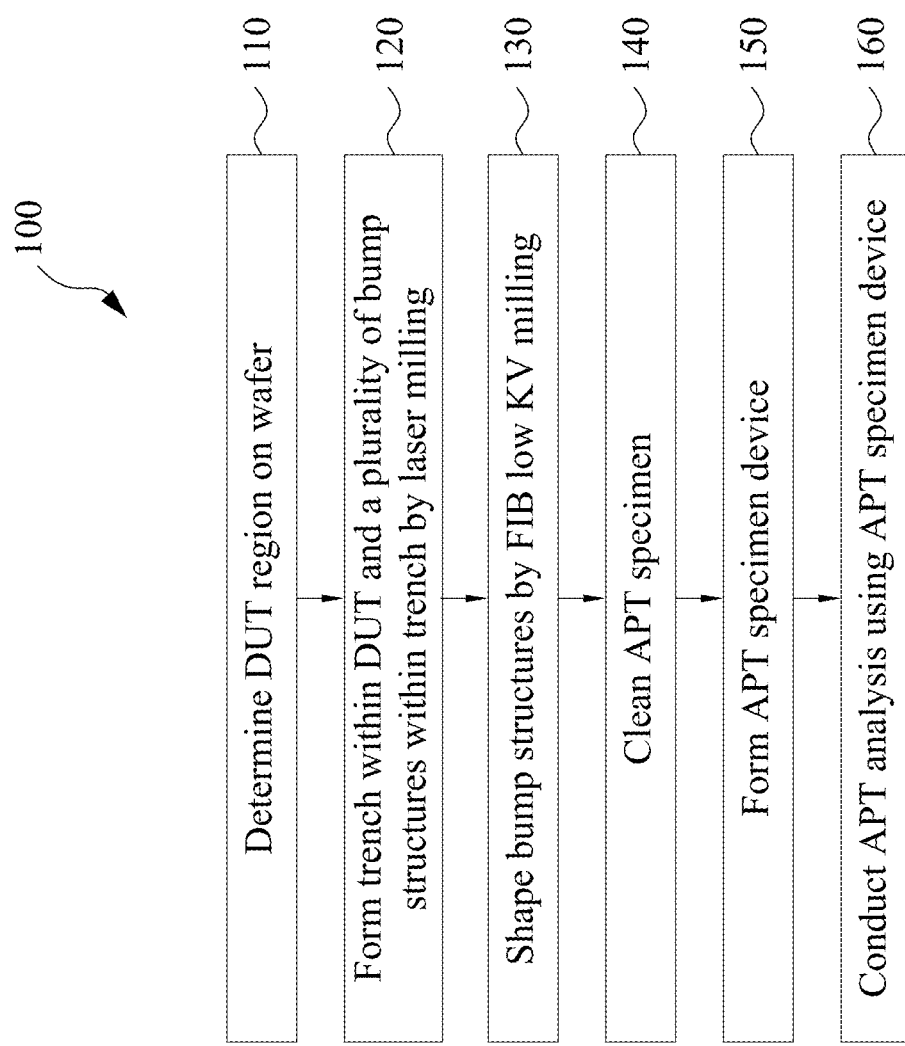
FIG. 1 is an example process according to example embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The disclosed techniques improve the APT technique by forming an APT specimen or sample directly on a wafer region under test, i.e., the DUT. The APT specimen is formed integrally to the substrate or the support structure, e.g., a carrier, under the APT specimen. Specifically, a first patterning, e.g., laser patterning, is conducted to form a trench in the DUT and one or more bump structures in the trench. The bump structures may have the shapes of a column, a cylinder, a cone, a pyramid or other shapes. The DUT may be removed from the wafer by laser cutting or other manipulator equipment, depending on the APT specimen design. The first patterning is relatively coarse, e.g., compared to a second patterning as will be described herein, and forms a coarse or rough surface texture on each of the bump structures. A second patterning process, e.g., a low-kV gas ion milling using a dual-beam focused ion beam ("FIB") microscopes, is then conducted on the bump structures to form the dimensions of the bump structures, e.g., through thinning. In some embodiments, the low kV FIB milling is conducted on a top portion of each bump structure to thin or sharpen the top portion. After the tips of the bump structures are sharpened by the low kV FIB milling, the bump structures become an APT specimen ready to be used for APT analysis. The low kV FIB milling forms a much finer granularity on the surface of the APT specimen. In some embodiments, the low kV FIB is conducted only on top portions of the bump structures to form needle-shaped or cone-shaped tip portions of the APT specimen. The lower portion of the APT specimen remains to have the coarse surface of the bump structures formed through the first patterning.

The resultant APT specimen is made integrally from the DUT. The sharpened upper portions and the coarse lower portion of the APT specimen are integrally obtained together from the DUT or the object wafer. The upper portions and the lower portion of the APT specimen are not welded together or coupled together through other coupling approaches. There is no welding materials or other foreign materials existing between the upper portion and the lower portion of the APT specimen. As a result, the mass resolution power ("MRP") of the APT specimen is improved. The higher MRP enables more accurate analysis of the material composition of the APT specimen. Further, the process of preparing the APT specimen is relatively simply and efficient. The resultant APT specimen is also more mechanically robust due to the relatively simple process.

FIG. 1 shows an example process 100. Referring to FIG. 1, in example act 110, a DUT region is determined on a wafer. FIG. 2 shows a DUT region 202 in a semiconductor wafer 200. As shown in FIG. 2, the DUT region 202 of the semiconductor wafer 200 includes a substrate 210 and a semiconductor structure 212 formed over the substrate 210. The semiconductor structure 212 may include a front-end-of-line ("FEOL") structure, e.g., a finFET device, or portions thereof, e.g., a source/drain structure of the finFET device and insulation regions, e.g., a shallow trench insulation ("STI"). The semiconductor structure 212 may also include backend-of-line ("BEOL") structures like interlayer dielectric layers, metallization layers, and/or devices formed on the BEOL layers, e.g., a thin film transistor. In some embodiments, the DUT region 202 extends vertically from the top surface 214 of the semiconductor structure 212 downward into the substrate 210, although the target layer to be analyzed in the APT, e.g., the region of interest ("ROI"), may be positioned anywhere between the top surface 214 and the substrate 210. In some embodiments, the target layer of the ROI in the semiconductor structure 212 is identified in the DUT. The identified target layer may be used to determine the orientation or dimensions of an APT specimen. For example, an APT specimen may be formed to include the target layer in a tip portion of the APT specimen.

Various approaches may be used to determine the DUT 202, which are all included in the scope of the disclosure. In some embodiments, image recognition under artificial intelligence is used to determine the surface region of the DUT 202 at the top surface 214 of the semiconductor structure 212. The ROI may be a static random access memory ("SRAM") cell, a logic unit, an integrated fan-out ("InFO") package, a thermal conductivity detector ("TCD"), a reverse osmosis (RO) unit, a scatterometry ("OCD") unit, a finFET device or other semiconductor devices, or elements thereof. In some embodiments, the layout information of the ROI may be obtained from a database, e.g., a GDSII database, and the layout image of the DUT region 202 on the top surface 214 may be estimated from the GDSII database information using artificial intelligence and machine learning. For example, machine learning may be used to smooth the edges of the lines, which represents or simulates the effect of actual fabrication processes on the line edges. The border lines of the DUT 202 on the top surface 214 of the semiconductor structure 212 are determined based on the layout image generated based on the GDSII data. Other approaches to determine the location of the DUT 202 are also possible and included within the scope of the disclosure.

In example act 120, with reference also to FIG. 3, a laser milling is conducted to form a trench 310 within the DUT 202. The laser milling also forms a plurality of bump structures 320 within the trench 310. In some embodiments, a solid state green UV laser is used to form the trench 310 and the bump structures 320. In some embodiments, the solid state UV laser may include resolutions in a range between about 4 to 12 microns and a power level at about 12 to about 20 watts. Other suitable lasers are also possible to be used in the laser milling, which are included within the scope of the disclosure. For example, excimer lasers, other solid state lasers, gas lasers, chemical lasers, fiber-hosted lasers, semiconductor lasers, dye lasers and/or free electron lasers each may be used in the laser milling/patterning.

The laser milling/patterning operation can be controlled by varying the pulse duration (e.g., from milliseconds to femtoseconds) and/or the flux of the laser. At a low laser flux, the semiconductor structure 212 and/or the substrate 210 absorbs laser energy and evaporates or sublimates. At high laser flux, the semiconductor structure 212 and/or the substrate 210 is typically converted to plasma. In some embodiments, ultrashort pulses, e.g., picosecond, femtosecond and/or nanosecond pulses, are used to pattern the DUT 202 to form the trench 310 and the bump structures 320. Due to the high peak intensities, such ultrashort pulses can effectively form the bump structures 320 through the rapid creation of plasma. The DUT 202 absorbs incident laser energy, resulting in direct vaporization from the DUT 202. Negligible collateral heating and shock-wave damage are created or applied onto the bump structures 320. As such, the material composition and other properties of the bump structures 320 remain unaffected through the laser patterning/milling process.

Other than a pulsed laser, the laser patterning/milling process may also use continuous wave and/or long pulse lasers, e.g., at high intensity. Different from a pulsed laser, continuous wave or long pulse (e.g., nanosecond) laser ablation heats a target material through the liquid phase to the vapor phase.

In some embodiments, an upper surface 322 of the bump structure 320 is substantially at a same level as an upper surface 324 of a bank portion 326 of the DUT 202 that surround the trench 310. In some other embodiments, the upper surface 322 of the bump structure 320 is lower than the upper surface 324 of the bank portion 326. The lowered upper surface 322 of the bump structure 320 facilitate APT analysis of a layer of the semiconductor structure 212 that is positioned below the upper surface 322.

Figure 4:
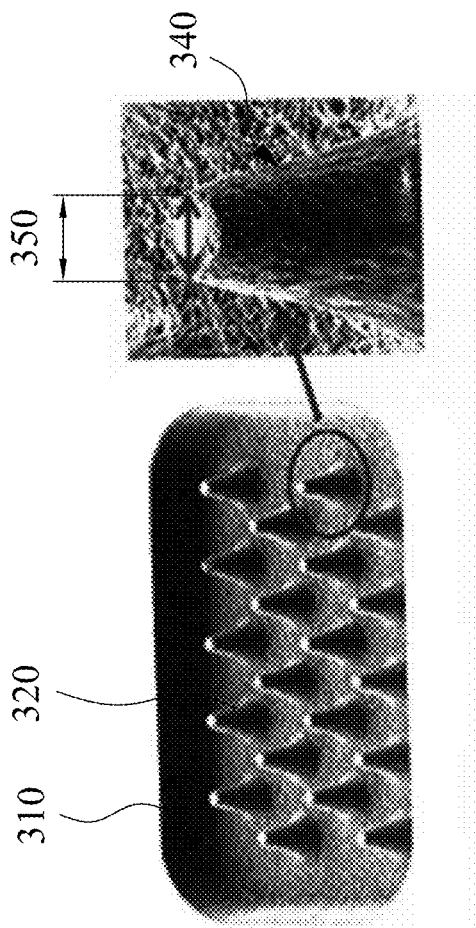

In some embodiments, the trench 310 extends downward into the substrate 210. That is, a bottom surface 330 of the trench 310 is lower than an upper surface 332 of the substrate 210. In some embodiments, the bump structure 320 includes an upper portion 340 and a lower portion 342. The upper portion 340 is a part of the semiconductor structure 212. Specifically, a portion of the target layer of the semiconductor structure 212 is included in the upper portion 340. The lower portion 342 is a part of the substrate 210. Typically, the substrate 210 is not a target for an APT analysis. The inclusion of the lower portion 342, e.g., part of the substrate 210, in the bump structure 320 improves the mechanical integrity of the APT specimen that is made from the bump structures 320, as described herein. In some embodiments, the lower portion 342 includes a large diameter 344 at the bottom and a smaller diameter 346 at the top of the lower portion 342. The upper portion 340 extends upwardly from the top of the lower portion 342, e.g., of a smaller diameter 346. In some embodiments, a top surface 348 of the upper portion 340 has a diameter 350 ranging from about 3 μm to about 10 μm. FIG. 4 shows some example bump structures 320 with relatively large top surfaces.

Figure 5:
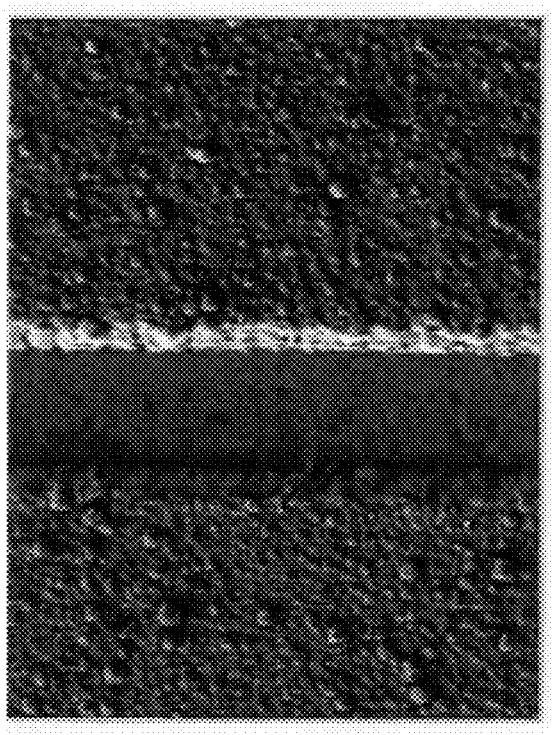

In some embodiments, as shown in FIG. 5, the laser milling/patterning produces a relatively rough surface on the bump structure. In some embodiments, the surface roughness of the bump structure 320 is in a range between about 50 nm to about 200 nm.

Figure 6:
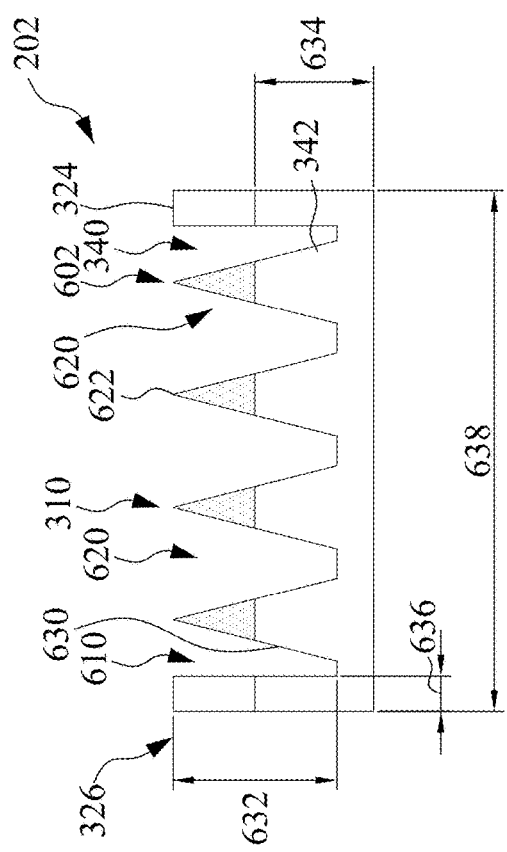

In example act 130, with reference also to FIG. 6, a FIB low KV milling is conducted on the bump structures 320 to further shape the upper portion 340. In some embodiments, the FIB low KV milling procedure includes a voltage level ranging between about 0.5 kV and about 1 kV. The low-kV FIB milling is controlled to prevent sample damage to the areas of interest during the milling. In some embodiments, the ion-beam interactions with the materials of various layers on the bump structure 320 are simulated under various beam energies. For example, the simulation estimates ion beam penetration depth and successive atom displacements in the bulk material caused by collision cascades. In particular, for high energies, these cascades extend the "damaged" area beyond the ion penetration depth. The simulation results may be used to control the FIB milling process.

For example, to avoid damaging the final APT specimen, the ion-beam energy is progressively lowered during the process down to the level of the low-kV milling at the final stage. Sample protection layers may also be used which prevents inhomogeneities from being introduced to the APT specimen. Further, different milling rates are used from the top to the bottom of the top portion 340 of the bump structure 320. Specifically, higher milling rates are applied to the top of the upper portion 340, resulting a needle-shaped tip end of the bump structure 320. After the low KV FIB milling process has been completed, an APT specimen 610 is formed, which includes needle-shaped tip portions 620.

Figure 7:
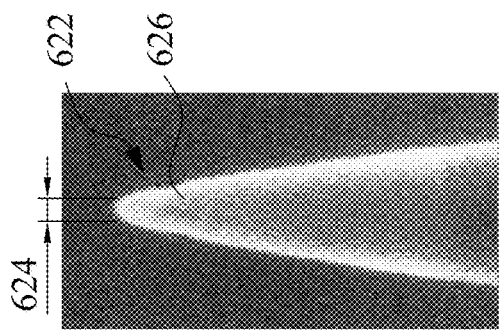

FIG. 7 shows an example needle-shaped tip portion 620. As shown in FIG. 7, the tip portion 620 includes a top surface 622 having a diameter 624 ranging between about 8 nm to about 50 nm, which is substantially thinner than that of the bump structures 320 of FIG. 4 that have a top surface diameter ranging from about 3 µm to about 10 µm. Further, the needle-shaped tip portion 620 includes a much finer texture on the top surface 622 and a side surface 626, with surface roughness being smaller than about 10 nm. In some embodiments, the side surface 630 (FIG. 6) of a lower portion of the specimen 610, e.g., the lower portion 342 of the bump structure 320, still has a relative rough surface with a roughness being in the range of between about 50 nm to about 200 nm.

Referring back to FIG. 6, the resultant APT specimen device 602 includes a bank structure 326 positioned outside, e.g., surrounding, the trench 310. The top surface 622 of one or more APT specimen 610 is substantially at a same level with or lower than an upper surface 324 of the bank structure 326. The APT specimen 610 includes a height 630 ranging between about 5 µm to about 300 µm. A first height 632 of the bank structure 326, e.g., from bottom surface 330 of the trench 310, ranges between about 250 µm to about 350 µm. A second height 634 of the bank structure 326, e.g., from bottom of the substrate 210, ranges 30650 µm to about 800 µm. A width 636 of the bank structure ranges between about 0.75 mm to about 1.5 mm. A width 638 of the APT specimen device 602 ranges between about 5 mm to about 10 mm.

In example operation 140, optionally, the APT specimen 610 is cleaned or thinned by etching or electrode polishing. For example, one or more of a drying etching process or a wet etching process may be conducted to clean the surface of the APT specimen 610 and/or further thin the surface of the APT specimen 610. In some embodiments, the etching process is conducted only on the lower portion 342 of the bump structure 320 that has a relatively rough surface. The upper portion 340 has gone through the low KV FIB milling and has a relatively fine surface, which does not need a cleaning. After the cleaning operation, the surface roughness of the lower portion 342 is improved to a range between about 10 nm to about 200 nm.

In example operation 150, an atom probe APT specimen device 602 is formed. The APT specimen device 602 including the trench 310, the APT specimen 610 and the bank structure 326 surrounding the trench 310.

In the description herein, an example APT specimen device 602 is described as including an APT specimen 610 arranged in a direction vertically extending upward with respect to the substrate 210. It should be appreciated that the APT specimen 610 may be formed in other directions depending on the DUT 202 and the layer(s) in the DUT 202 to be analyzed. For example, the tips of the needle-shaped specimen 610 may point laterally, e.g., substantially in parallel to the substrate 210, or may be pointing to any direction as long as the to-be-analyzed layer is contained in the specimen 610 in a suitable location for the APT analysis purposes. The laser milling process of forming the bump structures 320 enables the flexible arrangements of the APT specimen orientation, e.g., the pointing direction of the tips of the needle-shaped specimen 610.

Because the APT specimen 610 of the APT specimen device 602 is integrally formed in the DUT 202 of the wafer 200, the APT specimen device 602 may have flexible sizes. For example, the APT specimen device 602 may include the size of a die, a portion of a wafer 200 or a whole wafer 200. The APT specimen device 602 may be removed from the wafer 200 or may remain as an integral part of the wafer 200.

In example operation 160, an APT analysis is conducted using the APT specimen device 602. Any suitable APT analysis procedures may be conducted on the APT specimen device 602, which are all included in the scope of the disclosure.

As the APT specimen 610 is integrally formed, it does not include a welding portion between an APT sample and a holder. The mass resolution power ("MRP") of the APT specimen 610 is substantially improved over those containing welding materials/layer between an APT sample and a holder. Experimental data shows that the MRP improvements are in the range between about 7.5% to about 50% over a comparable APT specimen that has an APT sample welded to a holder. The improved MRP enables that more robust and reliable analysis be conducted using the APT specimen.

The present disclosure may be further appreciated with the description of the following embodiments:

In a method embodiment, a wafer is received. The wafer includes a substrate and a semiconductor structure over the substrate. A trench is formed within a first surface region of the semiconductor structure and a bump structure is formed in the trench. The bump structure includes a portion of the semiconductor structure. An atom probe tomography specimen is formed by thinning at least an upper portion of the bump structure.

In a method embodiment, a wafer is received. The wafer includes a semiconductor structure over a substrate. A target layer is identified in the semiconductor structure. A trench is formed on a surface of the semiconductor structure. A sample structure is formed in the trench through laser milling. The sample structure includes a portion of the target layer. At least a tip portion of the sample structure is thinned through focused ion beam such that an atom probe specimen device is formed that that includes the trench, the sample structure and a bank structure surrounding the trench.

A device includes a substrate and a cone-shaped structure over the substrate. The cone shaped structure includes a first portion and a second portion. The first portion includes a first surface roughness, and the second portion includes a second surface roughness that is different from the first surface roughness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a wafer having a semiconductor structure over a substrate;
a trench on a surface of the semiconductor structure;
a bank structure surrounding the trench;
a sample structure in the trench, the sample structure including a portion of the semiconductor structure, a tip portion of the sample structure including a first surface roughness that is finer than a second surface roughness of a lower portion of the sample structure, the tip portion and the lower portion including different materials, the lower portion including a portion of the substrate.

2. The structure of claim 1, wherein the sample structure is integrally included on the substrate.

3. The structure of claim 1, wherein the tip portion of the sample structure is substantially at a same level as or lower than an upper surface of the bank structure with respect to the substrate.

4. The structure of claim 1, wherein the sample structure includes a portion of the substrate.

5. The structure of claim 1, wherein the second surface roughness ranges from about 50 nm to about 200 nm, inclusive.

6. The structure of claim 1, wherein the first surface roughness is finer than about 10 nm.

7. The structure of claim 1, wherein the tip portion of the sample structure is needle-shaped over the lower portion of the sample structure.

8. A device, comprising:
a substrate;
a semiconductor structure over the substrate;
a trench in the semiconductor structure;
a cone-shaped bump structure in the trench, the bump structure including an upper portion and a lower portion, the upper portion and the lower portion including different materials, the lower portion including a portion of the substrate; and
a bank structure surrounding the trench.

9. The device of claim 8, wherein the upper portion is thinner than the lower portion.

10. The device of claim 8, wherein the upper portion includes a finer surface roughness than the lower portion.

11. The device of claim 8, wherein the lower portion includes a surface roughness ranging between about 50 nm to about 200 nm, inclusive.

12. The device of claim 8, wherein the upper portion includes a surface roughness finer than about 10 nm.

13. The device of claim 8, wherein an upper end of the upper portion is substantially at a same level as an upper surface of the bank structure.

14. The device of claim 8, wherein an upper end of the upper portion is lower than an upper surface of the bank structure.

15. The device of claim 8, wherein a top surface of the upper portion includes a diameter ranging between about 8 nm to about 50 nm, inclusive.

* * * * *